United States Patent
Kao

(10) Patent No.: US 6,903,611 B2
(45) Date of Patent: Jun. 7, 2005

(54) AUTOMATIC GAIN CONTROL DEVICE

(75) Inventor: Hsueh-Wu Kao, Hsin Chu County (TW)

(73) Assignee: Mediatek Inc., Hsin Chu (TW)

(*) Notice: Subject to any disclaimer, the term of this patent is extended or adjusted under 35 U.S.C. 154(b) by 34 days.

(21) Appl. No.: 10/957,657

(22) Filed: Oct. 5, 2004

(65) Prior Publication Data

US 2005/0040890 A1 Feb. 24, 2005

Related U.S. Application Data

(63) Continuation-in-part of application No. 10/614,869, filed on Jul. 9, 2003, now Pat. No. 6,816,013.

(30) Foreign Application Priority Data

Jul. 25, 2002 (TW) ........................................ 91116677 A

(51) Int. Cl.[7] .............................. H03G 3/10; H04B 1/06
(52) U.S. Cl. ...................... 330/279; 330/134; 455/234.1
(58) Field of Search ................................. 330/129, 134, 330/138, 279; 455/232.1, 234.1, 245.1

(56) References Cited

U.S. PATENT DOCUMENTS

| | | |
|---|---|---|
| 5,917,372 A | 6/1999 | Kakura et al. |
| 6,289,044 B1 | 9/2001 | Velez et al. |
| 6,297,698 B1 | 10/2001 | Callahan, Jr. et al. |

*Primary Examiner*—Khanh V. Nguyen
(74) *Attorney, Agent, or Firm*—Birch, Stewart, Kolasch, & Birch, LLP

(57) ABSTRACT

An automatic gain control device without being influenced by leakage current of a capacitor. The automatic gain control device includes a first control loop, a second control loop, and a multiplexer. The first control loop receives an input voltage and generates a first control voltage. The second control loop receives the first control voltage, digitizes the first control voltage, and outputs a second control voltage by a DAC. The multiplexer chooses the first control voltage or the second control voltage as a gain control voltage according to a hold signal. Because the second control loop digitizes and holds the first control voltage and output the second control voltage from the DAC, the gain control voltage can be held constant for a long time without being influenced by leakage current.

9 Claims, 6 Drawing Sheets

AUTOMATIC GAIN CONTROL DEVICE

CROSS-REFERENCE TO RELATED APPLICATIONS

This invention is a continuation-in-part of commonly assigned U.S. patent application Ser. No. 10/614,869, filed Jul. 9, 2003 now U.S. Pat. No. 6,816,013.

BACKGROUND

The invention relates to an automatic gain control (AGC) device, and more particularly to an AGC device without being influenced by leakage current An automatic gain control (AGC) device generates an output signal with desired amplitude by providing a properly stable gain control voltage for input signals with different amplitudes. Referring to FIG. 1, a conventional AGC device 10 includes a variable gain amplifier (VGA) 11, a top detector 12, a bottom detector 13, a subtractor 14, a target setting unit 15, a comparator 16, a charge pump 17, and a low pass filter (LPF) 18. The control device 10 receives an input signal Vin and outputs an output signal Vo from the VGA 11, whose gain, called the AGC gain, is controlled according to a gain control voltage Vg. The top detector 12 and the bottom detector 13 are used to detect a top voltage Vt and a bottom voltage Vb of the output signal Vo, respectively. The subtractor 14 calculates a voltage difference Vd between the top voltage Vt and the bottom voltage Vb, wherein the voltage difference Vd represents a peak-to-peak amplitude of the output signal Vo. Thereafter, the comparator 16 compares the voltage difference Vd with a target value Vs and then generates a comparison value. The comparison value is fed to the charge pump 17 for outputting a current signal, which is further fed to the LPF 18 for output the gain control voltage Vg to the VGA 11. The operation principle is further described in the following. When the comparison value is HIGH, it indicates that the voltage difference Vd is smaller than the target value Vs. At this time, the charge pump 17 charges the LPF 18 to increase the gain control voltage Vg such that the gain of the VGA 11 is increased, the dynamic range of the output signal Vo is increased, and the corresponding voltage difference Vd is also increased. Eventually, the voltage difference Vd will be equal to the target value Vs. On the contrary, if the voltage difference Vd is greater than the target value Vs, the charge pump 17 will discharge the LPF 18 to reduce the gain control voltage Vg. Therefore, the gain of the VGA 11 is dropped to decrease and the corresponding voltage difference Vd is also decreased. Eventually, the voltage difference Vd will be equal to the target value Vs.

The control device 10 utilizes a closed control loop to form an optimum gain control voltage for setting an optimum gain control. However, in some occasions (e.g., in a long-time seeking of an optical storage system), the amplitude of the input signal Vin to the VGA 11 is un-regular, then, it is desired that the operation of the control loop can be disabled temporally by trying holding the gain control voltage Vg for a period of time in order to avoid improper operations of the AGC device. Unfortunately, in practical, the gain control voltage Vg output from the LPF 18 can not be held due to the inherent leakage current of the LFP 18, which in turn still varies the AGC gain and may cause errors in system operations.

SUMMARY

In view of the above-mentioned problems, an object of the invention is to provide an AGC device, which is free from being influenced by leakage current and capable of holding the gain control voltage for a long time.

To achieve the above-mentioned object, the invention provides an AGC device including a first control loop, a second control loop, and a multiplexer. The first control loop receives an input signal and generates a first control voltage accordingly. The second control loop receives the first control voltage, digitizes the first control voltage, and outputs a second control voltage. The multiplexer selectively chooses the first control voltage or the second control voltage as a gain control voltage according to a holding signal.

The second control loop includes a second comparator, an up/down counter, a digital-to-analog converter (DAC), a hold control unit, and a counting signal generator. The second comparator has a positive terminal for receiving the first control voltage and a negative terminal for receiving the second control voltage, and outputs a comparison signal. The up/down counter receives a comparison signal as an up/down counting control signal, up-counts when the comparator outputs HIGH, down-counts when the comparator outputs LOW, receives a counting signal as a counting trigger signal for counting, and outputs a count value accordingly. The DAC converts digital data of the count value into the second control voltage Vh. The hold control unit generates the hold signal according to a hold command. The counting signal generator receives the hold signal, stops generating the counting signal to hold the result of the counter when the hold signal is LOW and enabled, and restores the counting signal to make the counter count normally when the hold signal is disabled.

Since the second control loop digitizes and holds the first control voltage value, only the second control voltage has to be output when the gain control voltage has to be held.

DETAILED DESCRIPTION

The AGC device of the invention will be described with reference to the accompanying drawings.

In view of the above-mentioned drawback of a conventional AGC device, the invention proposes an AGC device utilizing, in addition to the conventional control loop, another control loop to digitally record the gain control voltage and use the digitally recorded gain control voltage when the AGC gain is needed to be held.

Figure 1:
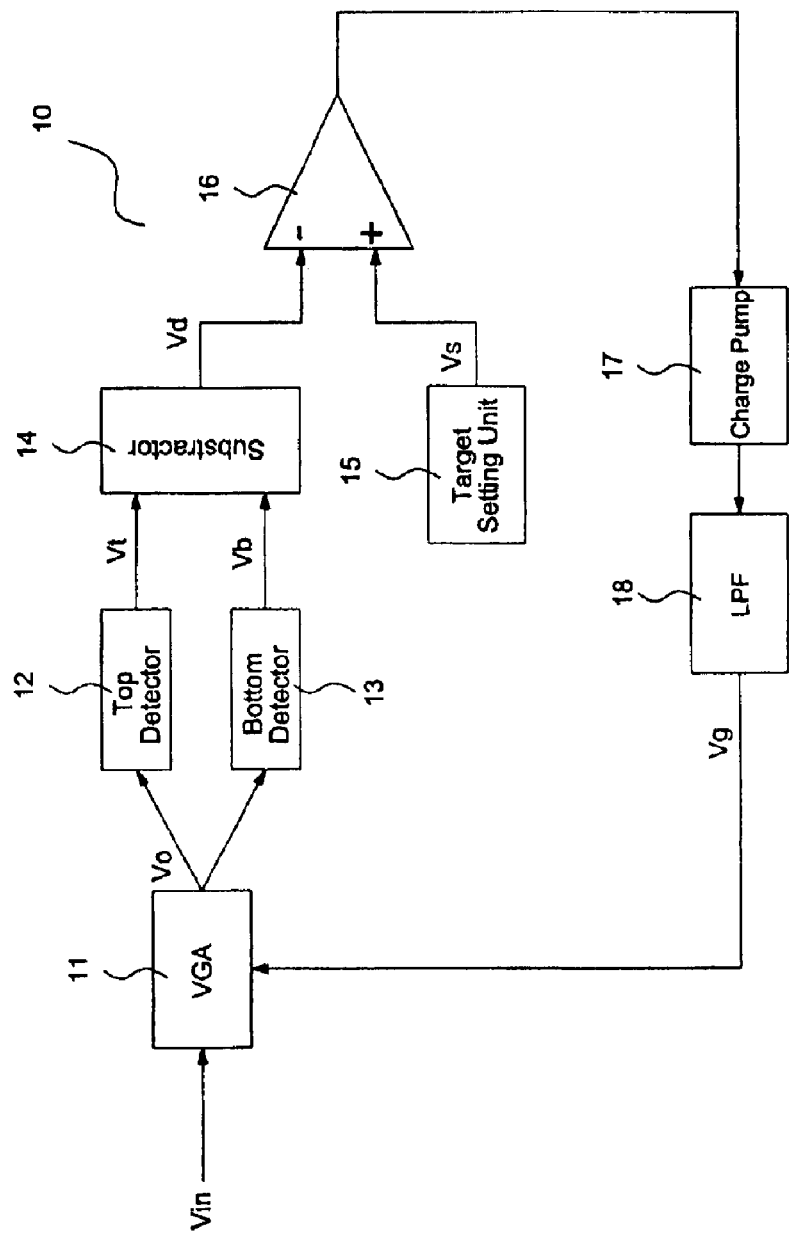
FIG. 1 shows a block diagram of a conventional AGC device.
Figure 2:
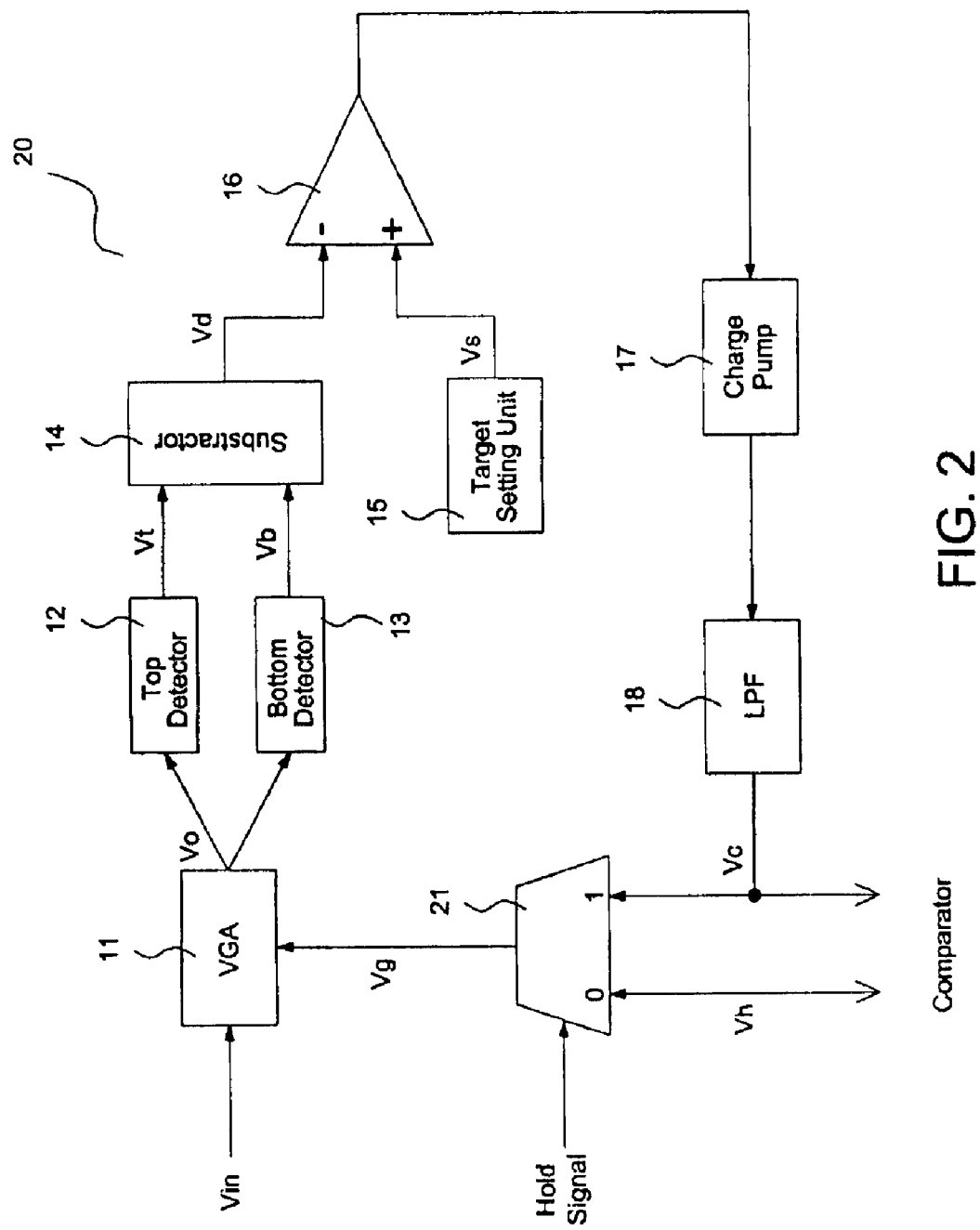
FIG. 2 shows a block diagram of a first control loop of the AGC device of the present invention.
Figure 3:
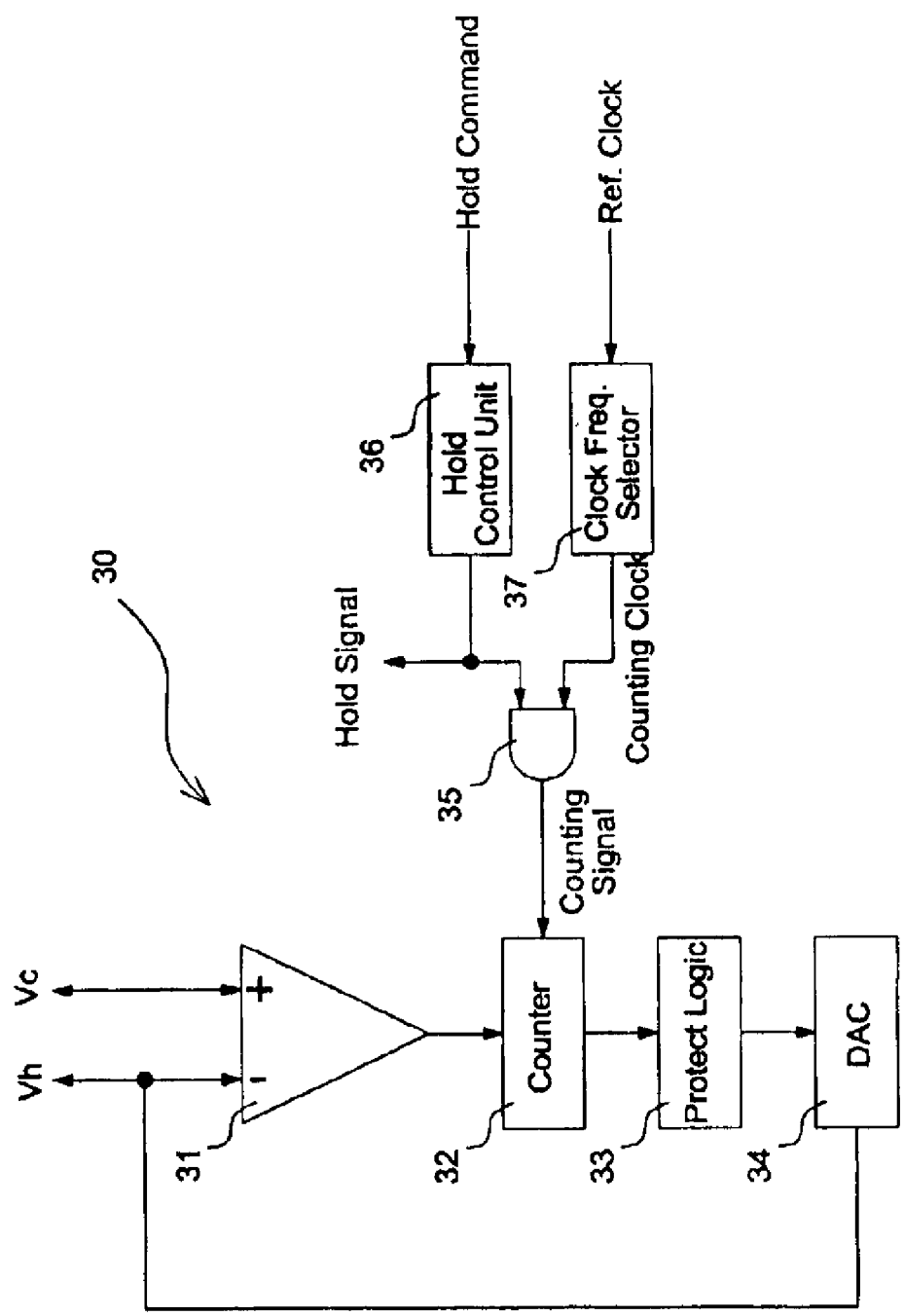
FIG. 3 shows a block diagram of a second control loop of the AGC device of the present invention.

FIGS. 2 and 3 show block diagrams of the AGC device of the invention, wherein FIG. 2 shows a first control loop while FIG. 3 shows a second control loop. The first control loop 20 includes a variable gain amplifier (VGA) 11, a top detector 12, a bottom detector 13, a subtractor 14, a target setting unit 15, a comparator 16, a charge pump 17, a LPF 18, and a multiplexer 21. The first control loop 20 is substantially the same as that of the conventional AGC device 10 except for the difference residing in that the multiplexer 21 is used to choose as a gain control voltage Vg from the first control voltage Vc generated by the first control loop 20 and the second control voltage Vh generated by the second control loop. Since the units such as the VGA 11, a top detector 12, a bottom detector 13, a subtractor 14, a target setting unit 15, a comparator 16, a charge pump 17, a LPF 18, and the like of the first control loop 20 have the same functions as shown in FIG. 1, detailed descriptions thereof will be omitted.

Referring to FIG. 3, the second control loop 30 includes a comparator 31, an up/down counter 32, a protect logic 33, a digital-to-analog converter (DAC) 34, an AND gate 35, a hold control unit 36, and a clock frequency selector 37. The comparator 31 receives the first control voltage Vc from the LPF 18 and the second control voltage Vh from the DAC 34, outputs HIGH when the first control voltage Vc is higher than the second control voltage Vh, and outputs LOW when the first control voltage Vc is lower than the second control voltage Vh. The counter 32 is an up/down counter for receiving the output signal of the comparator 31 and the counting signal from the AND gate 35. When the comparator 31 outputs HIGH, the counter 32 up-counts the pulse number of the counting signal; when the comparator 31 outputs LOW, the counter 32 down-counts the pulse number of the counting signal. When the hold signal is enabled, there is no pulse in the counting signal and the count value of the counter 32 is held unchanged. The protect logic 33 receives the count value of the counter 32 and protects the count value from overflowing. For example, if the counter 32 is a 6-bit counter, when the current count value is 111111 and the counter 32 still up-counts, the protect logic 33 will protect the count value from becoming 000000 by remaining the current count value. However, if the output range of the DAC 34 is ensured greater than the variation range of the first control voltage Vc under various gain requirements, the protect logic 33 can be omitted without affecting the invention. The DAC 34 receives the digital signal, the output value authenticated by the protect logic 33, and converts it into an analog signal, the second control voltage Vh, to the comparator 31 and the multiplexer 21.

The hold control unit 36 receives a hold command of the system and controls the hold signal according to the hold command. That is, when the hold command is "to hold the gain control voltage", the hold control unit 36 outputs LOW to enable the hold signal; and when the hold command is "to immediately respond the gain control voltage", the hold control unit 36 outputs HIGH to disable the hold signal. The clock frequency selector 37 receives a reference clock and divides the frequency of the reference clock into the counting clock with desired frequency. The AND gate 35 receives the counting clock and the hold signal, outputs the counting clock when the hold signal is disabled, and outputs LOW indicating to hold the result of the counter when the hold signal is enabled. Thus, when the hold signal is disabled, the counter 32 counts up or down according to the counting signal so as to make the second control voltage Vh output from the DAC 34 being tracking to the first control voltage Vc output from the LPF 18. On the other hand, when the hold signal is enabled, the value of the counter 32 will be kept unchanged. Thus, the second control voltage Vh will be also held constant. In this case, the multiplexer 21 outputs the second control voltage Vh to the VGA 11, so the gain control voltage Vg fed into the VGA 11 equals to the second control voltage Vh and thus is also held unchanged.

When the hold signal is disabled, the multiplexer 21 outputs the first control voltage Vc to the VGA 11. Thus, the operation of the first control loop 20 is substantially the same as that of the conventional AGC device 10 (FIG I) in this stage. When the hold signal is enabled, the multiplexer 21 outputs the second control voltage Vh output from the DAC 34 of second control loop 30 to the VGA 11. In this state, since the input value of the DAC 34 is held unchanged, the control gain voltage Vg for the VGA 11 is held constant without being affected by the leakage current of the capacitor 18.

Figure 4:
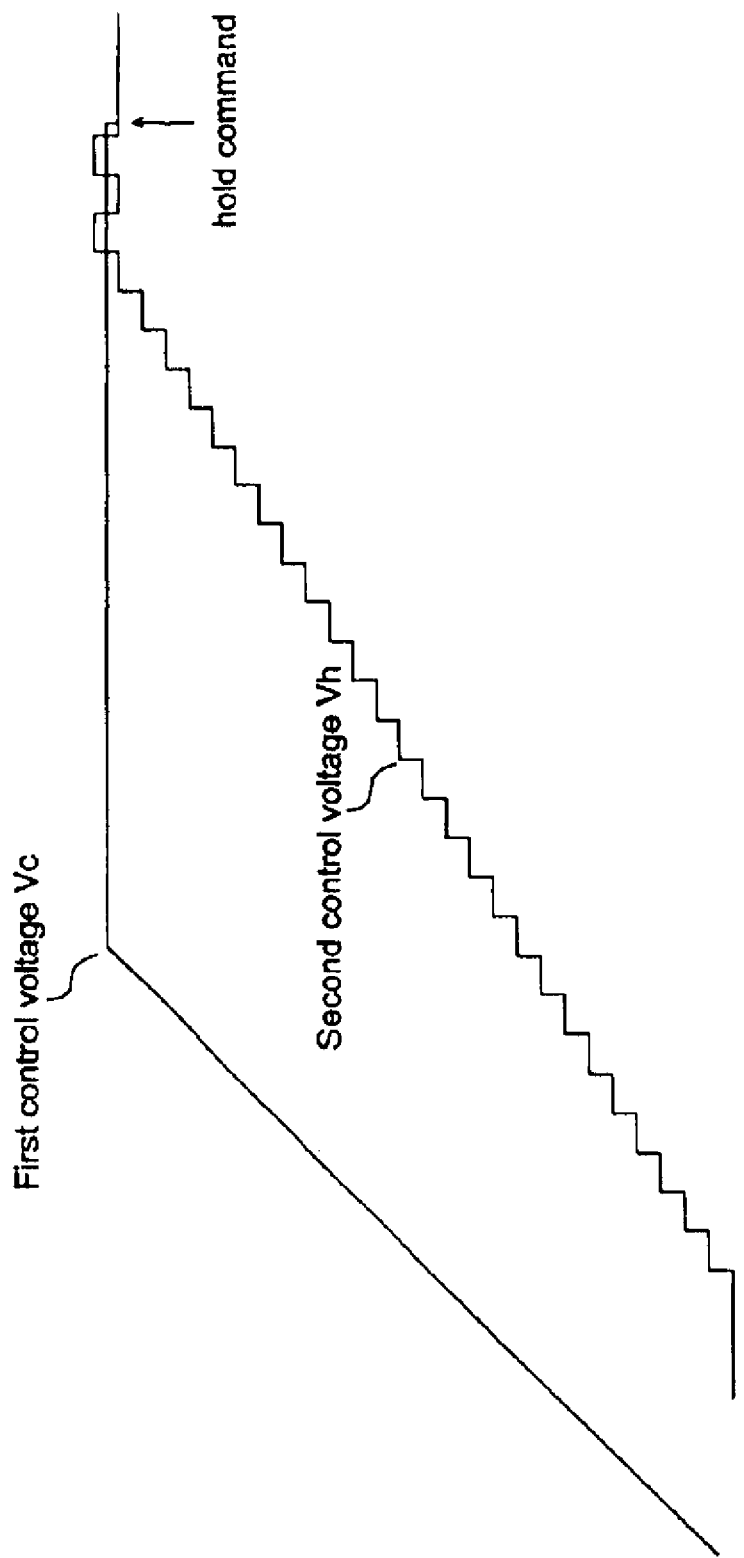
FIG. 4 is a schematic illustration showing a relationship between the first and second control voltages of the present invention.

FIG. 4 is a schematic illustration showing an exemplar relationship between the first control voltage Vc and the second control voltage Vh according to the invention. As shown in the drawing, when the AGC device starts operating, the second control voltage Vh output from the DAC 34 will trace the variation of the first control voltage Vc because the hold signal is initially disabled. At the beginning, the control loop of the AGC is not stable yet. Then, the first control voltage Vc changes gradually until it finally converges at a stable voltage value. Under the control of the up/down counter 32 in the second control loop 30, the second control voltage Vh will trace the variation of the first control voltage Vc, and finally approaches to the first control voltage Vc, as shown in FIG. 4. When the hold command becomes "to hold the AGC gain", the hold control unit 36 enables the hold signal and the counter 32 stops counting. Thus, the second control voltage Vh output from the DAC 34 is held constant. Meanwhile, the multiplexer 21 outputs the second control voltage Vh to the VGA 11. Consequently, the AGC device of the invention can hold the AGC gain for a long time.

Figure 5:
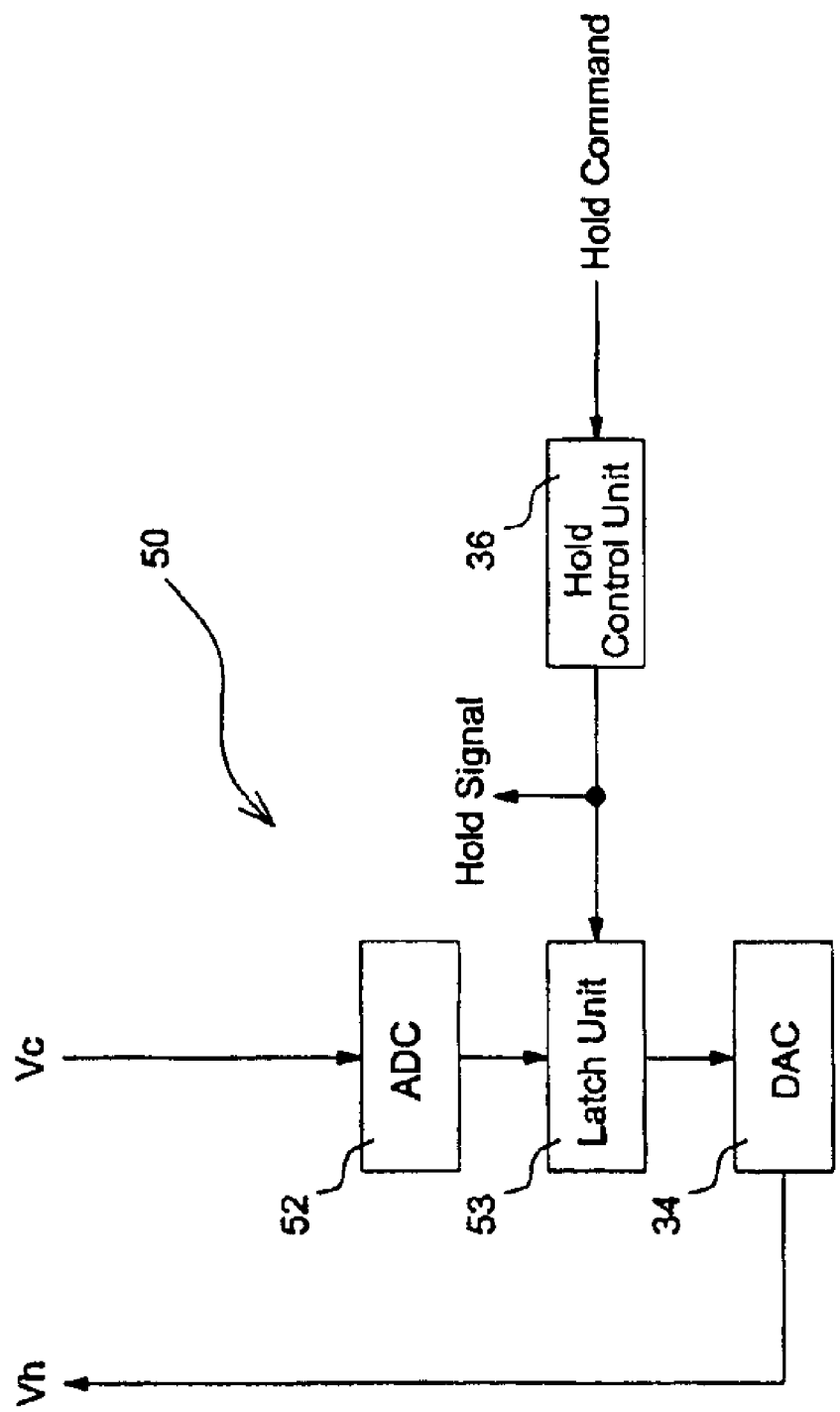
FIG. 5 shows a block diagram of another embodiment of a second control loop of the AGC device of the present invention.

FIG. 5 shows a block diagram of another embodiment of a second control loop of the AGC device of the present invention. The second control loop 50 of the AGC device includes an ADC 52, a latch unit 53, a DAC 34 and a hold control circuit 36. The ADC 52 receives the first control voltage Vc output from the LPF 18 and converts the first control voltage Vc into a digital data. The latch unit 53 receives the digital data, latches the digital data, and outputs the digital data as a latched data, which will be held unchanged when the hold signal is enabled. The DAC 34 receives the latched data and converts the latched data into a second control voltage Vh. Therefore, when the hold signal is enabled, the multiplexer 21 in the first control loop outputs the second control voltage Vb output from the DAC 34 to the VGA 11. In this state, since the input value of the DAC 34 is held unchanged, the gain control voltage Vg output to the VGA 11 is held constant without being affected by the leakage current of the capacitor 18.

Figure 6:
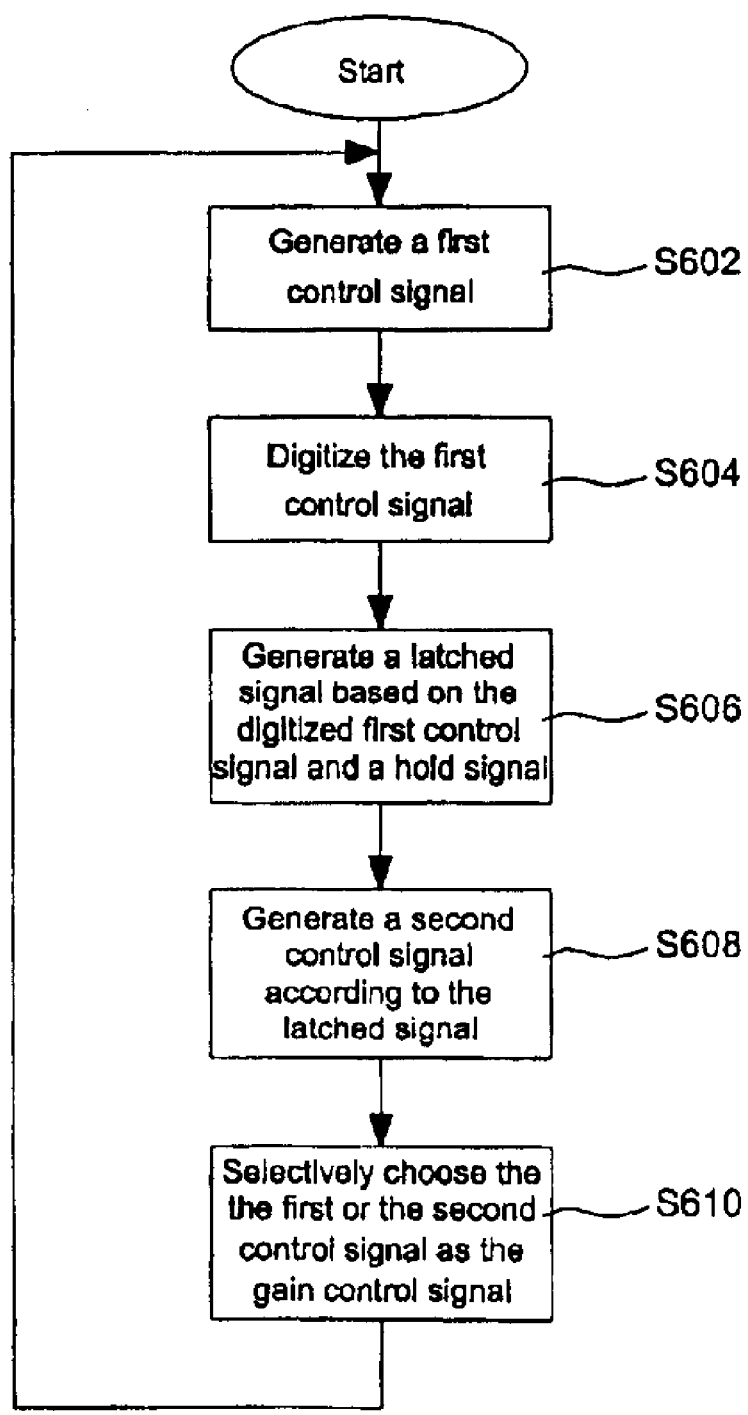
FIG. 6 shows a flow chart of the present invention for generating the gain control signal of the AGC device of the present invention.

A method for generating an AGC signal in the automatic gain controller is illustrated in FIG. 6. The method includes the steps of:

Step S602: generate a first control signal according to an input signal.

Step S604: digitize the first control signal.

Step S606: generate a latched signal based on the digitized first control signal and a hold signal. When the hold signal is disabled, the latched signal is obtained by latching the digitized first control signal. When the hold signal is enabled, the latched signal is kept unchanged.

Step S608: generate a second control signal according to the latched signal.

Step S610: selectively choose the first control signal or the second control signal as the gain control signal for the VGA according to the hold signal. That is, the second control signal is chose as the gain control signal for the VGA when the hold signal is enabled, otherwise the first control signal is chose as the gain control signal for the VGA.

While certain exemplary embodiments have been described and shown in the accompanying drawings, it is to be understood that such embodiments are merely illustrative of and not restrictive on the broad invention, and that this invention not be limited to the specific construction and arrangement shown and described, since various other modifications may occur to those ordinarily skilled in the art.

What is claimed is:

1. An automatic gain control (AGC) device having an adjustable gain, comprising:
   a first control loop for receiving an input voltage and generating a first control voltage;
   a second control loop for receiving the first control voltage, digitizing the first control voltage, and outputting a second control voltage based on the digitized first control voltage and a hold signal; and
   a multiplexer for selecting the first control voltage or the second control voltage as a gain control signal for controlling the gain of the automatic gain control device.

2. The AGC device according to claim 1, wherein the first control loop comprises:
   a variable gain amplifier for receiving the input voltage and amplifying the input voltage to generate an output voltage according to the gain control signal;
   a top detector for receiving the output voltage and outputting a top voltage;
   a bottom detector for receiving the output voltage and outputting a bottom voltage;
   a subtractor for receiving the top voltage and the bottom voltage and outputting a voltage difference between the top voltage and the bottom voltage;
   a first comparator for receiving the voltage difference of the subtractor and a target voltage and generating a comparison signal;
   a charge pump for receiving the comparison signal and generating a current signal; and
   a low pass filter for receiving the current signal and generating the first control voltage.

3. The AGC device according to claim 1, wherein the second control loop comprises:
   a second comparator for receiving the first control voltage and the second control voltage and outputting a comparison signal;
   an up/down counter for counting up or down the pulse number of a counting signal according to the comparison signal, and outputting a count value;
   a digital-to-analog converter for converting the count value into the second control voltage; and
   a counting signal generator for receiving the hold signal, outputting the counting signal with predetermined frequency when the hold signal is disabled, and holding the counting signal at a constant level when the hold signal is enabled.

4. The AGC device according to claim 1, wherein the second control loop further comprises a count value protect logic for protecting the count value from overflowing.

5. The AGC device according to claim 1, wherein the second control loop comprises:
   an ADC for receiving the first control voltage and converting the first control voltage into a digital data;
   a latch unit for receiving the digital data and the hold signal and outputting a latched data; and
   a DAC for receiving the latched data and outputting the second control voltage.

6. The AGC device according to claim 5, wherein the latched data is kept unchanged when the hold signal is enabled.

7. A method for generating an gain control, signal in an automatic gain control device, comprising the steps of:
   generating a first control signal according to an input voltage;
   digitizing the first control signal;
   generating a latched signal based on the digitized first control signal and a hold signal;
   generating a second control signal according to the latched signal; and
   selectively choosing the first control signal or the second control signal as the gain control signal according to the hold signal.

8. The method according to claim 7, wherein a latched data is kept unchanged when the hold signal is enabled.

9. The method according to claim 7, wherein the second control signal is chose as the gain control signal when the hold signal is enabled, otherwise the first control signal is chose as the gain control signal.

* * * * *